United States Patent
Guo

(10) Patent No.: US 10,868,281 B2
(45) Date of Patent: Dec. 15, 2020

(54) FABRICATING METHOD OF OLED DEVICE WITH BASE SUBSTRATE HAVING IMPROVED WATER AND OXYGEN BLOCKING PERFORMANCE

(71) Applicant: Wuhan China Star Optoelectronics Semiconductor Display Technology Co., Ltd., Hubei (CN)

(72) Inventor: Tianfu Guo, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 204 days.

(21) Appl. No.: 15/741,111

(22) PCT Filed: Nov. 2, 2017

(86) PCT No.: PCT/CN2017/109113
§ 371 (c)(1),
(2) Date: Sep. 27, 2018

(87) PCT Pub. No.: WO2019/051959
PCT Pub. Date: Mar. 21, 2019

(65) Prior Publication Data
US 2019/0088907 A1 Mar. 21, 2019

(30) Foreign Application Priority Data
Sep. 18, 2017 (CN) .......................... 2017 1 0841649

(51) Int. Cl.
*H01L 29/08* (2006.01)
*H01L 51/56* (2006.01)
(Continued)

(52) U.S. Cl.
CPC .......... *H01L 51/56* (2013.01); *H01L 27/1214* (2013.01); *H01L 27/1266* (2013.01);
(Continued)

(58) Field of Classification Search
CPC . H01L 51/56; H01L 27/1214; H01L 27/1266; H01L 51/52; H01L 51/5253;
(Continued)

(56) References Cited

U.S. PATENT DOCUMENTS

| | | | |
|---|---|---|---|
| 6,465,953 B1 | 10/2002 | Duggal | |
| 2003/0045021 A1* | 3/2003 | Akai | H01L 51/56 438/99 |
| 2007/0170324 A1* | 7/2007 | Lee | H01L 51/5237 248/247 |
| 2007/0170423 A1* | 7/2007 | Choi | C03C 17/40 257/40 |
| 2010/0072884 A1* | 3/2010 | Tchakarov | C03C 17/3626 313/504 |

(Continued)

*Primary Examiner* — Caleb E Henry
(74) *Attorney, Agent, or Firm* — Hemisphere Law, PLLC; Zhigang Ma

(57) ABSTRACT

The disclosure discloses a fabricating method of an OLED device, including the following steps: coating a polyimide material on a glass substrate to form a base substrate, the base substrate including a material capable of absorbing water and oxygen; fabricating an OLED device layer on the TFT layer; the disclosure also discloses a corresponding OLED device. In the embodiment of the disclosure, the water and oxygen blocking performance of the PI layer in the OLED device can be enhanced, and the service life of the OLED device can be improved.

7 Claims, 2 Drawing Sheets

(51) Int. Cl.
  *H01L 51/00*    (2006.01)
  *H01L 51/52*    (2006.01)
  *H01L 27/12*    (2006.01)
(52) U.S. Cl.
  CPC ........ *H01L 51/003* (2013.01); *H01L 51/0034* (2013.01); *H01L 51/52* (2013.01); *H01L 51/5237* (2013.01); *H01L 51/5253* (2013.01); *H01L 51/5259* (2013.01); *H01L 2227/326* (2013.01); *H01L 2251/5338* (2013.01)
(58) Field of Classification Search
  CPC ............... H01L 51/5259; H01L 51/003; H01L 51/0034; H01L 51/5237; H01L 2251/5338; H01L 2227/326
  USPC .......................................................... 257/40
  See application file for complete search history.

(56) References Cited

U.S. PATENT DOCUMENTS

| | | | |
|---|---|---|---|
| 2012/0217535 A1* | 8/2012 | Van de Weijer | H01L 51/5253 257/100 |
| 2012/0248466 A1* | 10/2012 | Park | H01L 51/5243 257/88 |
| 2014/0204291 A1* | 7/2014 | Kung | G06F 3/041 349/12 |
| 2014/0252325 A1* | 9/2014 | Kim | H01L 51/5259 257/40 |
| 2015/0188084 A1 | 7/2015 | Kang et al. | |
| 2016/0035998 A1* | 2/2016 | Hahm | H01L 51/5253 257/40 |

* cited by examiner

FABRICATING METHOD OF OLED DEVICE WITH BASE SUBSTRATE HAVING IMPROVED WATER AND OXYGEN BLOCKING PERFORMANCE

RELATED APPLICATIONS

The present application is a National Phase of International Application Number PCT/CN2017/109113, filed Nov. 2, 2017, and claims the priority of China Application No. 201710841649.X, filed Sep. 18, 2017.

FIELD OF THE DISCLOSURE

The disclosure relates to the field of display technology, and in particular to a fabricating method of an OLED device and a corresponding OLED device.

BACKGROUND

The organic light emitting diode (OLED) display is a very promising technique in flat panel display, which has characteristics such as self-emission, simple structure, ultra-thin, fast response, wide viewing angle, low power consumption, and can realize a flexible display. At present, the OLED displays has been noticed by the major manufacturers, and became the third-generation display after Cathode Ray Tube (CRT) display and a liquid crystal display (LCD) display.

However, the OLED is extremely sensitive to water and oxygen. At present, the commonly used OLEDs often use top emitting light, so the blocking water/oxygen requirements of the surface of the thin film encapsulation (TFE) are extremely high. There are many patents that propose how to improve the performance of blocking water and oxygen of the upper TFE. However, for OLEDs, water and oxygen not only invade from the top, but also intrude into the interior of the OLED through the underlying substrate. Therefore, it is especially important to avoid the intrusion of water and oxygen from the bottom of the OLED substrate.

Flexible OLED has higher requirements of the substrate performance. In order to meet the requirements of product performance and the back-end fabricating process, OLED substrate is often required the properties such as flexible, bending-resistant, and high temperature resistant. Currently in OLED industry, since the polyimide (PI) film itself has the advantages such as high temperature resistant (up to 400° C.) and low coefficient of thermal expansion (<10), PI is often selected as a base substrate of the flexible OLED. However, the PI substrate has poor performance of blocking water and oxygen, so the outside water vapor can be easily intruded through the PI substrate into the OLED device, thereby shortening the service life of the OLED.

SUMMARY

A technical problem to be solved by the disclosure is to provide a fabricating method of an OLED device and a corresponding OLED device, which can improve the water and oxygen blocking performance of a base substrate in an OLED device.

To solve the technical problem, an aspect of an embodiment of the disclosure provides a fabricating method of an OLED device, including the following steps:

coating a polyimide material on a glass substrate to form a base substrate, the base substrate including a material capable of absorbing water and oxygen;

fabricating a thin film transistor (TFT) layer on the base substrate;

fabricating an OLED device layer on the TFT layer;

fabricating a thin film encapsulation layer on the OLED device layer so that the thin film encapsulation layer completely covers the OLED device layer; and peeling off the glass substrate from the base substrate, and attaching a protective layer to a side of the base substrate away from the TFT layer.

The step of fabricating the TFT layer on the base substrate further includes:

forming an inorganic barrier layer on the base substrate; and fabricating the TFT layer on the inorganic barrier layer.

The step of fabricating the TFT layer on the base substrate further includes:

forming an inorganic barrier layer on the base substrate; and coating a polyimide material on the inorganic barrier layer to form a second base substrate layer, the second base substrate layer including the material capable of absorbing water and oxygen; and fabricating the TFT layer on the second base substrate layer.

The step of coating a polyimide material on a glass substrate to form a base substrate specifically includes:

doping the material capable of absorbing water and oxygen to a polyimide solution for fabricating the base substrate; and a weight ratio of the material capable of absorbing water and oxygen to the polyimide solution being not more than 5%; and coating the polyimide solution doped capable of absorbing water and oxygen on the glass substrate by a coater and then performing high temperature baking and ultraviolet curing to obtain the base substrate.

The materials capable of absorbing water and oxygen includes at least one of CaO, BaO, NaOH, $CaCl_2$, and $MgCl_2$.

Accordingly, another aspect of an embodiment of the disclosure also provides an OLED device including:

a base substrate, including a material capable of absorbing water and oxygen;

a TFT layer disposed on an upper side of the base substrate;

an OLED device layer disposed on the TFT layer;

a thin film encapsulation layer disposed on the OLED device layer, wherein the thin film encapsulation layer completely covers the OLED device layer.

A protective layer is attached to a side of the base substrate away from the TFT layer.

An inorganic barrier layer is further disposed between the base substrate and the TFT layer.

Between the base substrate and the TFT layer further includes:

an inorganic barrier layer disposed on the base substrate; and a second base substrate layer disposed on the inorganic barrier layer, and the base substrate includes the material capable of absorbing water and oxygen; and the TFT layer is disposed on the second base substrate layer.

The materials capable of absorbing water and oxygen includes at least one of CaO, BaO, NaOH, $CaCl_2$, and $MgCl_2$.

Accordingly, still another aspect of the embodiment of the disclosure further provides an OLED device, including:

a base substrate, including a material capable of absorbing water and oxygen, and the materials capable of absorbing water and oxygen including at least one of CaO, BaO, NaOH, $CaCl_2$, and $MgCl_2$;

a TFT layer disposed on an upper side of the base substrate;

an OLED device layer disposed on the TFT layer;

a thin film encapsulation layer disposed on the OLED device layer; and the thin film encapsulation layer completely covering the OLED device layer.

A protective layer is attached to a side of the base substrate away from the TFT layer.

An inorganic barrier layer is further disposed between the base substrate and the TFT layer.

Between the base substrate and the TFT layer further includes:

an inorganic barrier layer disposed on the base substrate; and a second base substrate layer disposed on the inorganic barrier layer, and the base substrate including the material capable of absorbing water and oxygen;

the TFT layer being disposed on the second base substrate layer.

The implementation of the embodiment of the disclosure has the following advantageous effects that In the embodiments of the disclosure, the materials that utilize the properties of absorbing water and oxygen (metal oxides such as CaO and BaO) tend to have better water-oxygen absorption properties; and the polyimide solution is doped with an appropriate amount of metal oxide, Through the coating technology of the polyimide solution, a base substrate layer including a metal oxide with strong water absorption property is fabricated, thereby improving the water and oxygen blocking performance of the base substrate layer;

In the disclosure, by selecting and adjusting the material type and doping ratio of the water and oxygen blocking performance doped into the polyimide solution, the water and oxygen blocking performance of the conventional base substrate can be greatly improved without any change of the other properties of the base substrate, which also do not affect the other process conditions of the base substrate based on the latter part of the base substrate. Therefore, fabricating the base substrate by this method is simple and feasible, and will not increase the additional process and is highly feasible.

BRIEF DESCRIPTION OF THE DRAWINGS

In order to illustrate technical schemes of the disclosure or the prior art more clearly, the following section briefly introduces drawings used to describe the embodiments and prior art. Obviously, the drawing in the following descriptions is just some embodiments of the disclosure. The ordinary person in the related art can acquire the other drawings according to these drawings without offering creative effort.

DETAILED DESCRIPTION OF PREFERRED EMBODIMENTS

The following sections offer a clear, complete description of this disclosure in combination with the embodiments and accompanying drawings. Obviously, the embodiments described herein are only a part of, but not all of the embodiments of this disclosure. In view of the embodiments described herein, any other embodiment obtained by those of ordinary skill in the art skilled in this art without offering creative effort is included in a scope claimed by the disclosure.

Here, it should be further noted that in order to prevent the disclosure to be obscured due to unnecessary details, only apparatus structures and/or processing steps closely related to the solution according to the disclosure are shown in the accompanying drawings, while other details having little relations are omitted.

Figure 1:
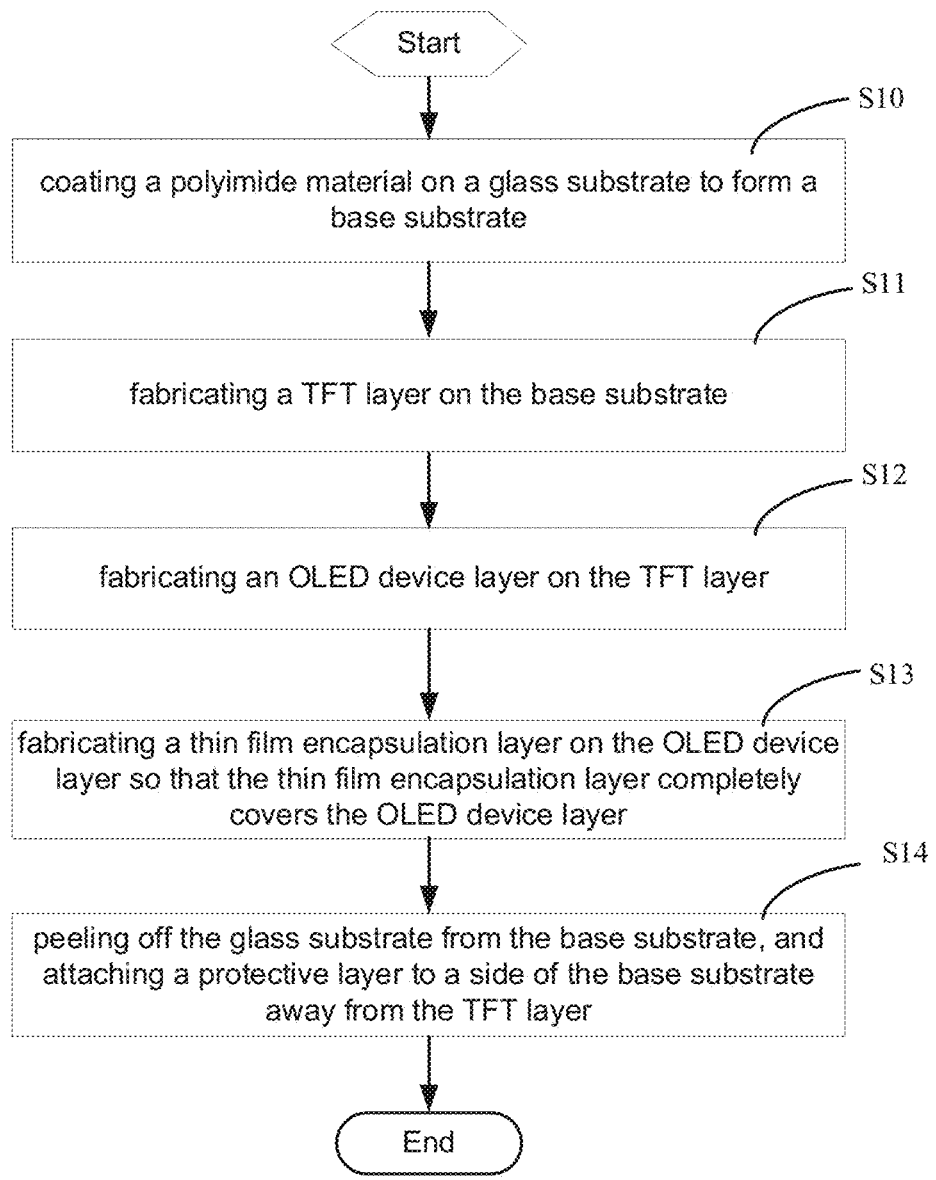
FIG. 1 is a main flow diagram of an embodiment of a fabricating method of an OLED device provided by the disclosure.

As shown in FIG. 1, which is a schematic diagram of a main flow chart of an embodiment of a fabricating method of an OLED device according to the disclosure; in this embodiment, the method includes the following steps:

Step S10: coating a polyimide material (PI solution) on a glass substrate to form a base substrate (PI layer), the PI layer including a material capable of absorbing water and oxygen, and the material capable of absorbing water and oxygen may be a metal oxide (such as CaO or BaO), or may be NaOH, $CaCl_2$), and $MgCl_2$; in some embodiments, a weight ratio of the material capable of absorbing water and oxygen to the polyimide solution is not more than 5%, which will not affect the process of PI solution.

Figure 2:
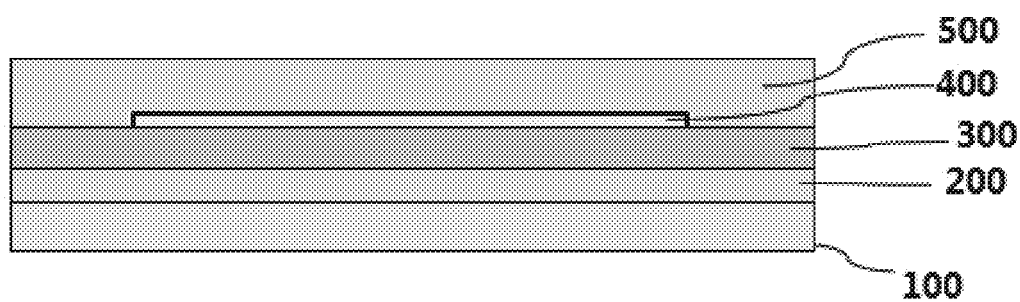
FIG. 2 is a schematic structural view of an OLED device in the fabricating process involved in FIG. 1.
Figure 3:
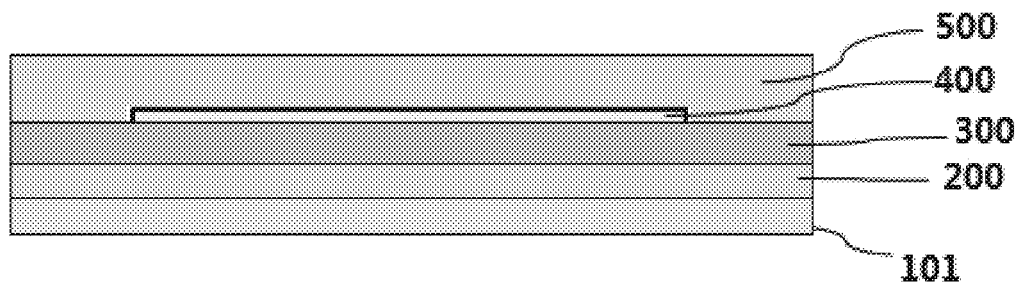
FIG. 3 is a schematic structural view of an embodiment of an OLED device structure provided by the disclosure.

Step S11: fabricating a TFT layer on the PI layer and forming TFT devices arranged in an array on the TFT layer;

Step S12: fabricating an OLED device layer on the TFT layer, for example, in one embodiment, the OLED device layer can be made by vacuum deposition;

Step S13: fabricating a thin film encapsulation layer on the OLED device layer so that the thin film encapsulation layer completely covers the OLED device layer; and the structure of the OLED device obtained through this step is as shown in FIG. 2. In some embodiments, the thin film encapsulation layer can be fabricated by means of CVD (chemical vapor deposition)/ALD (atomic layer deposition)/IJP (inkjet printing);

step S14: peeling off the glass substrate from the base substrate, and attaching a protective layer to a side of the base substrate away from the TFT layer, thereby obtaining a flexible OLED device (as shown in FIG. 3).

It may be understood that in another embodiment of the disclosure, the step S11 specifically includes:

fabricating an inorganic barrier layer on the PI layer, and the inorganic barrier layer may be a SiN, $SiO_2$, SiON and others, so as to further improve the water and oxygen blocking performance; and fabricating the TFT layer on the inorganic barrier layer.

It is to be understood that in still another embodiment of the disclosure, two or more PI layers may appear. Specifically, in an example, the step S11 specifically includes:

forming an inorganic barrier layer on the base substrate;

coating a polyimide material on the inorganic barrier layer to form a second base substrate layer, the second base substrate layer including a material capable of absorbing water and oxygen; and fabricating the TFT layer on the second base substrate layer.

It can be understood that the step of coating the polyimide material on the glass substrate to form the base substrate in step S10 in the embodiment of the disclosure specifically includes:

doping the material capable of absorbing water and oxygen to a polyimide solution for fabricating the base substrate, and the materials capable of absorbing water and oxygen includes at least one of CaO, BaO, NaOH, $CaCl_2$, and $MgCl_2$; the specific doping ratio may be determined according to the need. In some embodiments, the material that absorbs water and oxygen is within 5% of the total weight of the PI solution;

coating the polyimide solution doped with the material capable of absorbing oxygen and oxygen on the glass substrate by a coater and then performing high temperature baking and ultraviolet curing to obtain the PI layer having excellent performance of blocking water and oxygen.

It is understandable that the step of coating a polyimide material on the inorganic barrier layer to form a second base substrate layer is the same as the above steps.

Accordingly, another aspect of the disclosure further provides an OLED device, which can be obtained by the fabricating method of the OLED device.

As shown in FIG. 3, a schematic structural view of one embodiment of an OLED device provided by the disclosure is shown. In the embodiment, the OLED device includes:

a barrier layer 101;

a base substrate 200 (PI layer), including the material capable of absorbing water and oxygen may be a metal oxide (such as CaO or BaO), or may be NaOH, $CaCl_2$, and $MgCl_2$; in some embodiments, a weight ratio of the material capable of absorbing water and oxygen to the polyimide solution is not more than 5%;

a TFT layer 300 disposed on the base substrate 200;

an OLED device layer 400 disposed on the TFT layer 300;

a thin film encapsulation layer 500 disposed on the OLED device layer 400, and the thin film encapsulation layer 500 completely covering the OLED device layer 400.

Figure 4:
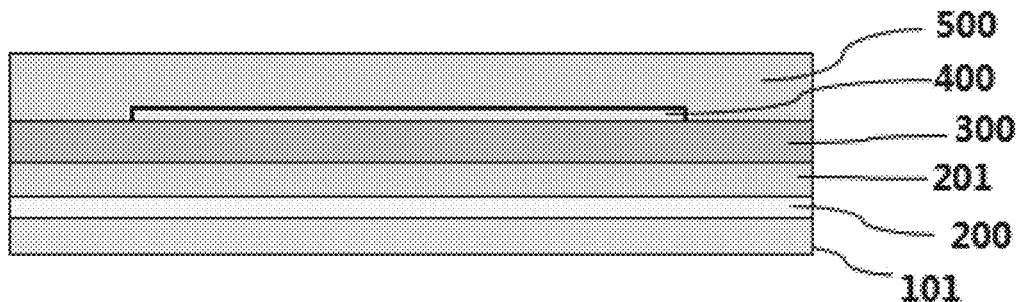
FIG. 4 is a schematic structural view of another embodiment of an OLED device structure provided by the disclosure.

As shown in FIG. 4, a schematic structural diagram of another embodiment of an OLED device according to the disclosure is shown. In this embodiment, the difference from the embodiment shown in FIG. 3 lies in that an inorganic barrier layer 201 is further disposed between the uppermost PI layer 200 and the TFT layer 300. The inorganic barrier layer 201 may be an inorganic film layer such as SiN, $SiO_2$, or SiON to further improve the blocking water and oxygen performance. It is understood that in some embodiments, the barrier layer 101 and the inorganic barrier layer 201 may adopt the same material.

Figure 5:
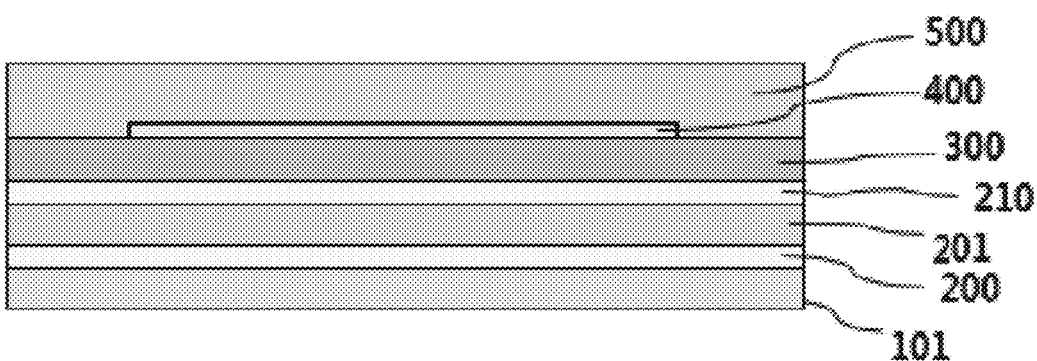
FIG. 5 is a schematic structural diagram of still another embodiment of a structure of an OLED device provided by the disclosure.

As shown in FIG. 5, a schematic structural diagram of a further embodiment of the OLED device provided by the disclosure is shown. In this embodiment, the difference from the embodiment shown in FIG. 3 lies in that between the base substrate and the TFT layer further includes:

an inorganic barrier layer 201 disposed on the base substrate 200; and a second base substrate layer 210 disposed on the inorganic barrier layer 201, the second base substrate layer 210 including a material capable of absorbing oxygen;

the TFT layer 300 being disposed on the second base substrate layer 210.

The second base substrate 210 can be obtained by the same process as that of the base substrate 200, and the material composition and performance thereof can be exactly the same.

The implementation of the embodiment of the disclosure has the following advantageous effects:

in the embodiments of the disclosure, the materials that utilize the properties of absorbing water and oxygen (metal oxides such as CaO and BaO) tend to have better water-oxygen absorbing property, and the polyimide solution is doped with an appropriate amount of metal oxide, through the coating technology of the polyimide solution, a base substrate layer including a metal oxide with strong water absorption property is fabricated, thereby improving the water and oxygen blocking performance of the base substrate layer;

In the disclosure, by selecting and adjusting the material type and doping ratio of the water and oxygen blocking performance doped into the polyimide solution, the water and oxygen blocking performance of the conventional base substrate can be greatly improved without any change of the other properties of the base substrate, which also do not affect the other process conditions of the base substrate based on the latter part of the base substrate. Therefore, fabricating the base substrate by this method is simple and feasible, and will not increase the additional process and is highly feasible.

It is to be noted that, in the context, relational terms such as first and second are used only to distinguish an entity or an operation from another entity or another operation without necessarily requiring or implying that such entities or operations have any such actual relationship or sequence. Moreover, terms "include", "comprise" or any other variant thereof is intended to encompass a non-exclusive inclusion such that processes, methods, articles, or devices that include a series of elements include not only those elements but also those that are not explicitly listed. In the absence of more restrictions, the elements defined by the statement "including a . . . " do not preclude the presence of additional elements in the process, method, article, or device that includes the elements.

What is claimed is:

1. A fabricating method of an OLED device, comprising the following steps:

coating a polyimide material on a glass substrate to form a base substrate;

wherein the base substrate comprises a material capable of absorbing water and oxygen;

fabricating a TFT layer on the base substrate;

fabricating an OLED device layer on the TFT layer;

fabricating a thin film encapsulation layer on the OLED device layer to make the thin film encapsulation layer completely covers the OLED device layer; and peeling off the glass substrate from the base substrate, and attaching a protective layer to a side of the base substrate away from the TFT layer.

2. The fabricating method of an OLED device according to claim 1, wherein the step of fabricating the TFT layer on the base substrate further comprises:

forming an inorganic barrier layer on the base substrate; and fabricating the TFT layer on the inorganic barrier layer.

3. The fabricating method of an OLED device according to claim 1, wherein the step of fabricating the TFT layer on the base substrate further comprises:
  forming an inorganic barrier layer on the base substrate;
  coating a polyimide material on the inorganic barrier layer to form a second base substrate layer;
  wherein the second base substrate layer comprises a material capable of absorbing water and oxygen; and
  fabricating the TFT layer on the second base substrate layer.

4. The fabricating method of an OLED device according to claim 2, wherein the step of coating the polyimide material on the glass substrate to form the base substrate specifically comprises:
  doping the material capable of absorbing water and oxygen to a polyimide solution for fabricating the base substrate, wherein a weight ratio of the material capable of absorbing water and oxygen to the polyimide solution is not more than 5%; and
  coating the polyimide solution doped with the material capable of absorbing water and oxygen on the glass substrate by a coater and then performing high temperature baking and ultraviolet curing to obtain the base substrate.

5. The fabricating method of an OLED device according to claim 4, wherein the materials capable of absorbing water and oxygen comprises at least one of CaO, BaO, NaOH, $CaCl_2$, and $MgCl_2$.

6. The fabricating method of an OLED device according to claim 3, wherein the step of coating a polyimide material on a glass substrate to form a base substrate specifically comprises:
  doping the material capable of absorbing water and oxygen to a polyimide solution for fabricating the base substrate, wherein a weight ratio of the material capable of absorbing water and oxygen to the polyimide solution is not more than 5%; and
  coating the polyimide solution doped with the material capable of absorbing water and oxygen on the glass substrate by a coater and then performing a high temperature baking and ultraviolet curing to obtain the base substrate.

7. The fabricating method of an OLED device according to claim 6, wherein the materials capable of absorbing water and oxygen comprises at least one of CaO, BaO, NaOH, $CaCl_2$, and $MgCl_2$.

* * * * *